United States Patent

Baxter

[11] Patent Number: 5,815,405
[45] Date of Patent: Sep. 29, 1998

[54] METHOD AND APPARATUS FOR CONVERTING A PROGRAMMABLE LOGIC DEVICE REPRESENTATION OF A CIRCUIT INTO A SECOND REPRESENTATION OF THE CIRCUIT

[75] Inventor: Glenn A. Baxter, Ben Lomond, Calif.

[73] Assignee: Xilinx, Inc., San Jose, Calif.

[21] Appl. No.: 614,113

[22] Filed: Mar. 12, 1996

[51] Int. Cl.⁶ .................................................. G06F 17/50
[52] U.S. Cl. ........................................... 364/489; 364/488
[58] Field of Search ..................................... 364/488, 489, 364/490, 491

[56] References Cited

U.S. PATENT DOCUMENTS

| | | | |
|---|---|---|---|
| 5,084,824 | 1/1992 | Lam et al. ................................ | 364/490 |
| 5,182,719 | 1/1993 | Kuroda et al. ........................... | 364/490 |
| 5,452,227 | 9/1995 | Kelsey et al. ............................ | 364/489 |
| 5,465,216 | 11/1995 | Rotem et al. ............................ | 364/488 |
| 5,475,605 | 12/1995 | Lin .......................................... | 364/488 |
| 5,475,695 | 12/1995 | Caywood et al. ........................ | 371/27 |
| 5,493,507 | 2/1996 | Shinde et al. ............................ | 364/489 |
| 5,497,378 | 3/1996 | Amini et al. ............................. | 371/22.3 |
| 5,510,999 | 4/1996 | Lee et al. ................................. | 364/491 |
| 5,526,278 | 6/1996 | Powell ..................................... | 364/489 |
| 5,563,801 | 10/1996 | Lee et al. ................................. | 364/491 |
| 5,590,049 | 12/1996 | Arora ...................................... | 364/489 |
| 5,594,657 | 1/1997 | Cantone et al. ......................... | 364/490 |

*Primary Examiner*—Emanuel Todd Voeltz
*Assistant Examiner*—Leigh Marie Garbowski
*Attorney, Agent, or Firm*—Kent Richardson; Jeanette S. Harms

[57] ABSTRACT

A method and apparatus for converting a programmable logic device representation of a circuit into a second representation of the circuit. A circuit design is first captured and converted into a first representation of the circuit design. The first representation is for programming a programmable logic device. A first part of the first representation is for programming a configurable element in the programmable logic device. The first part of the first representation is used as a set of parameters for a general model of the configurable element. The second representation of the circuit includes the parameterized general model of the configurable element.

19 Claims, 5 Drawing Sheets

METHOD AND APPARATUS FOR CONVERTING A PROGRAMMABLE LOGIC DEVICE REPRESENTATION OF A CIRCUIT INTO A SECOND REPRESENTATION OF THE CIRCUIT

BACKGROUND OF THE INVENTION

1. Field of the Invention

This invention relates to the field of circuit design. In particular, the invention relates to a method and apparatus for converting a programmable logic device representation of a circuit into a second representation of the circuit.

2. Description of the Related Art

Programmable Logic Devices (PLDs) are a class of devices that allow a user to program a device to perform the function of a particular circuit. Examples of PLDs are FPGAs (Field Programmable Gate Arrays) and EPLDs (Erasable Programmable Logic Devices).

To use a PLD, a user captures a circuit design using any of several design capture tools. The user then uses software tools to convert the captured design into a device specific bitwise representation. The bitwise representation programs the PLD to perform the function of the circuit design. The PLD, having read in the bitwise representation, then performs the function of the circuit design.

For a high volume production, a user may want to move a circuit design from a PLD to another integrated circuit technology (the target technology), such as a mask programmable application specific integrated circuit. Typically, the user will convert to this target technology when the cost of using the PLD exceeds the cost of using the target technology to implement the circuit design.

Another way of converting the circuit design to a target technology has been to analyze the PLD's netlist representation of the circuit design. A tool examines the netlist, decides which components to include in a new representation of the design, and generates an HDL description of the circuit. For example, an XNF™ (Xilinx Netlist Format) file represents the netlist of a circuit design in a Xilinx FPGA. A software tool examines the XNF file and decides which devices to instantiate in an HDL representation of the circuit design. The software tool makes several tests to decide which devices to instantiate. This method of converting the circuit design to an HDL representation has several drawbacks. First, the software tool must make many decisions about which devices to include based upon the netlist file. Thus, the software tool is complex and therefore difficult to test, maintain and expand. Second, because the conversion is done by the software tool, it is very difficult to prove that the resulting HDL representation is a true and accurate description of the PLD representation of the circuit. Third, additional circuit components may need to be added to the new integrated circuit. For example, boundary scan circuits and RAM test circuits may need to be added to the new integrated circuit. The software tool must be changed to include these additional circuits. Fourth, the software tool needs to be maintained for many PLD architectures, thereby adding complexity to the software tool.

Therefore, what is needed is an improved method and system for converting the PLD representation of a circuit design to a target technology integrated circuit representation of that circuit design. Such a method and system should accept any circuit design realized for a PLD. It should provide the user, or other person responsible for performing the conversion, with the ability to include additional structures that are part of the PLD, but not otherwise described in the circuit design. The method and system should be simple to use and maintain. The method and system should generate a true and accurate description of the PLD representation of the circuit.

SUMMARY OF THE INVENTION

A method and apparatus for converting a Programmable Logic Device (PLD) representation of a circuit into a second representation of the circuit is described. A circuit design is first captured and converted into a first representation of the circuit design. The first representation is for programming a PLD. A first part of the first representation is for programming a configurable element in the PLD. The first part of the first representation is used as a set of parameters for a general model of the configurable element. The second representation of the circuit includes the parameterized general model of the configurable element.

In one embodiment of the invention, a computer parses the device specific bitwise representation used to program a PLD. The computer identifies the various configurable elements being programmed by the bitwise representation, and identifies the actual configuration of the identified elements. For each configurable element represented in the bitwise representation, a new instance of that type of element is included in a pre-compile representation of the circuit design. Each instance is parameterized with the actual configuration information of the corresponding configurable element. The parameterization gives one embodiment of the invention the advantage of creating an accurate pre-compile representation of the circuit design as the circuit design is implemented in the PLD. Note that the pre-compile representation may include definitions of structures that are not necessary to implement the originally captured circuit design. The pre-compile representation is compiled with a target fabrication technology library to create a post-compile representation. The post-compiled representation has unnecessary structures removed. The post-compiled representation is then processed further to be used to manufacture a new integrated circuit that implements the originally captured circuit design.

In one embodiment, the pre-compile representation is created independently from the target fabrication technology library. Therefore, a user, or other person responsible for performing the conversion, can choose among many different target fabrication technology libraries. This flexibility allows a user, or other person responsible for performing the conversion, to more easily reduce his/her costs of manufacturing the new integrated circuit. Although many details have been included in the description and the figures, the invention is defined by the scope of the claims.

DETAILED DESCRIPTION OF THE DRAWINGS

Generating a Second Representation of a Circuit

Figure 1A:
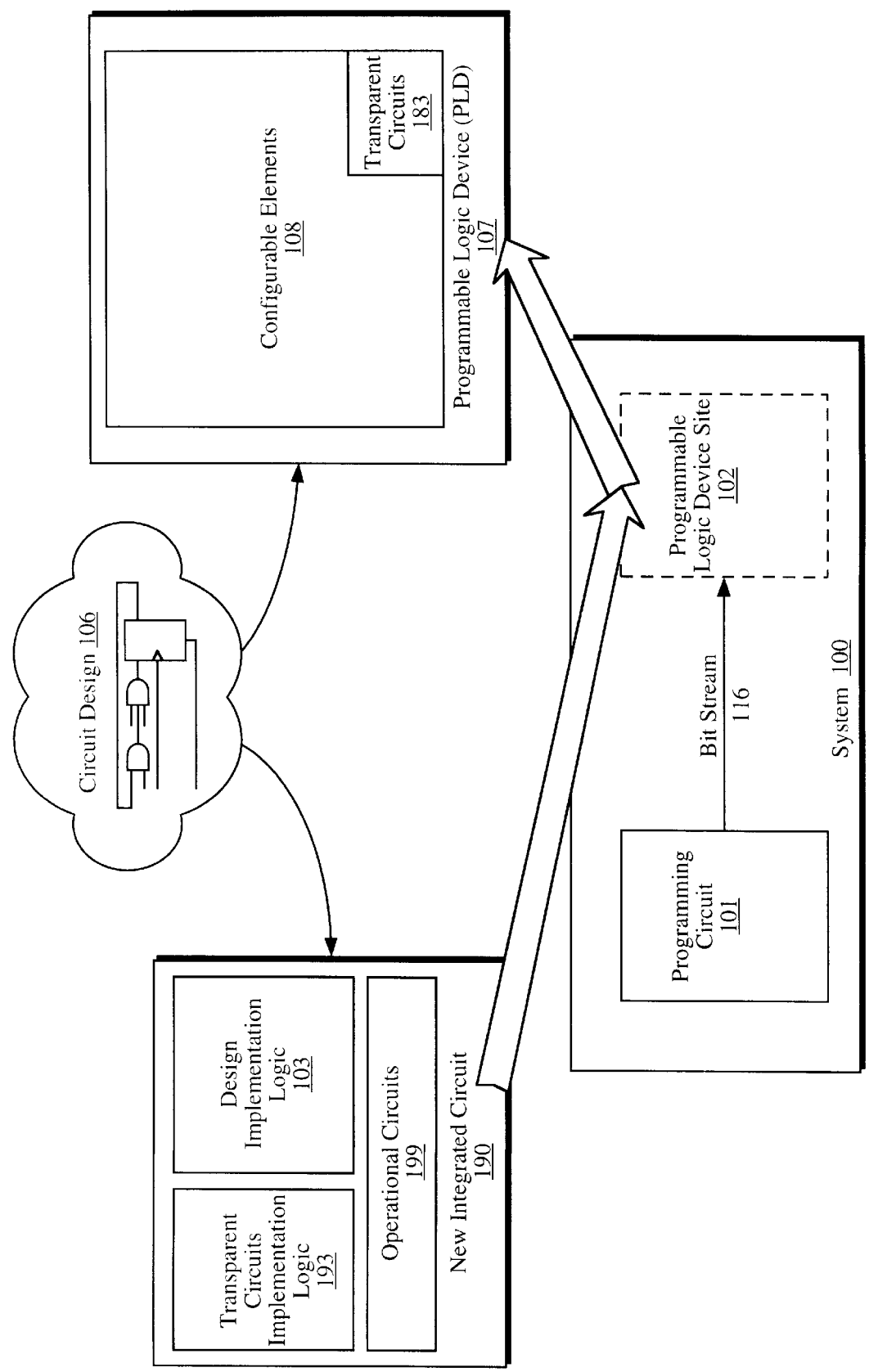
FIG. 1A illustrates a system where a new integrated circuit, created from a description of a circuit in a Programmable Logic Device (PLD), has been substituted for that PLD.

FIG. 1A illustrates a system 100 where a new integrated circuit 190, created from a description of a circuit design 106 in a Programmable Logic Device (PLD) 107, has been substituted for that PLD 107. In the following discussion, the PLD 107 refers to the general class of PLDs and is not specifically restricted to a particular type or family of PLDs.

The PLD 107 includes a number of configurable elements 108 that are programmed to perform the functions of the circuit design 106. The new integrated circuit 190 includes design implementation logic 103 that also implements the functions of the circuit design 106. However, the new integrated circuit 190 implements the functions of the circuit design 106 as those functions are implemented in the PLD 107. This high degree of compatibility is an important feature of the invention because the user need not redesign the system 100 when the new integrated circuit 190 is substituted for the PLD 107.

To achieve the high degree of compatibility, in one embodiment, the data used to program the PLD 107 is used in the creation of the new integrated circuit 190. The system 100 includes a programming circuit 101 which communicates, via a number of busses, with a device mounted in the programmable logic device site 102. The programming circuit 101 generates a bit stream 116 for programming the PLD 107 when the PLD 107 is mounted in the programmable logic device site 102. In one embodiment, the bit stream 116 is used in the creation of the new integrated circuit 190.

In one embodiment, the PLD 107 includes a number of transparent circuits 183. Note that the invention does not necessarily require the transparent circuits 183. The transparent circuits 183 are not completely represented in the circuit design 106. The transparent circuits 183 are (1) referenced, but not defined, and/or are (2) not referenced in the circuit design 106. For example, assuming a user wishes to use the referenced, but not defined, transparent circuits 183, the user includes a description of how to connect to the transparent circuits 183 in the circuit design 106. Note that the user need not include a detailed description of the internal workings of the transparent circuits 183. Examples of the referenced, but not defined, transparent circuits 183 is an oscillator/a clock divider circuit. The XC4000 FPGA includes such an oscillator/a clock divider circuit. As for the second type of transparent circuits 183, even though the user did not include a reference to the transparent circuits 183 in the circuit design 106, the system 100 may require that the not referenced transparent circuits 183 exist for proper operation. An example of a transparent circuit 183 that is not referenced in the circuit design 106 is a boundary scan circuit. The new integrated circuit 190 includes transparent circuits implementation logic 193 that perform the functions of the transparent circuits 183 that are used in the system 100.

In one embodiment, the new integrated circuit 190 includes operational circuits 199. The operational circuits 199 implement additional functions that the user, or other person responsible for performing the conversion, wishes the new integrated circuit 190 to perform but were not supported in the PLD 107. For example, the operational circuits 199 include full scan test logic and RAM test logic.

Figure 1B:
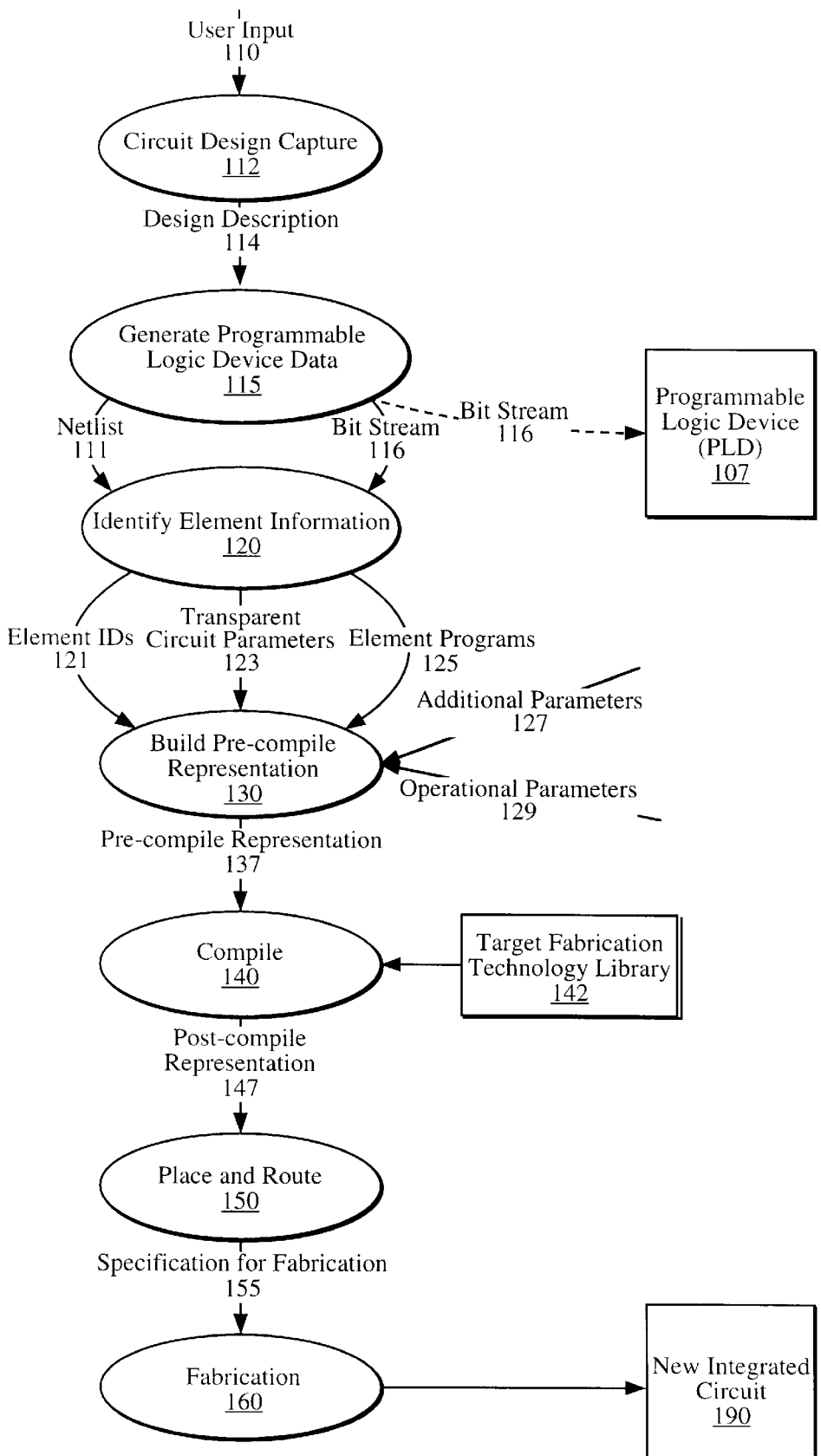
FIG. 1B illustrates one embodiment of a method of converting a PLD representation of a circuit into a new integrated circuit.

FIG. 1B illustrates one embodiment of a method in accordance with the present invention of converting a Programmable Logic Device (PLD) representation of a circuit design 106 into a second representation of that circuit design 106. This embodiment is implemented using one or more computers.

At the circuit design capture step 112, a user supplies a software tool with the user input 110 to define a circuit design 106. ViewLogic, Inc. of Milpitas, Calif. supplies such software tools, for example, the ViewDraw™ tool.

From the circuit design capture step 112, a design description 114 is created. In one embodiment, the design description 114 includes an HDL description of the circuit design 106. In another embodiment, the design description 114 includes a netlist description of the circuit design 106.

At step 115, the PLD data representing the circuit design 106 is generated. In one embodiment, the XACT™ software, version 5.0, provided by Xilinx Inc., having an address at 2100 Logic Drive, San Jose, Calif., is used in step 115. In another embodiment, MAX+PLUS II™ software from Altera, Inc., is used in step 115. Importantly, the following steps are performed independently of how the original circuit design 106 is captured in step 112, and how the PLD data is generated in step 115. Thus, the invention has the advantage of accepting any circuit design 106 realized for a PLD.

Step 115 generates a netlist 111 representation of the circuit design 106 in a particular PLD. In one embodiment, the netlist 111 includes an XNF file. (The XNF file was generated from an LCA file. The bitwise representation of the circuit design 106 is generated from the LCA file. The XNF file is the human readable form of the LCA file. An LCA2XNF™ software tool, also from Xilinx, Inc., converts an LCA file to the XNF file.) Thus, the XNF file includes a netlist description of a programmed PLD that implements the circuit design 106. For example, assuming that the circuit design 106 is a multiplier and the PLD 107 is an XC4000™ FPGA, the corresponding XNF file includes a netlist description of how the XC4000 FPGA is programmed to implement the multiplier design. Importantly, the netlist 111 does not necessarily include representations of the transparent circuits implementation logic 193 or representations of the operational circuits 199.

Step 115 also generates a bit stream 116 which includes the bitwise representation of the circuit design 106. In the above-referenced multiplier example, the bit stream 116 is read into an XC4000 FPGA to configure the FPGA to function as the multiplier circuit.

At step 120, in one embodiment, the information for programming each configurable element in the PLD is parsed from the netlist 111 and/or the bit stream 116. The element IDs 121 identify the configurable elements in the bit stream 116 while the element programs 125 identify the program for each configurable element. For example, one sequence of bits from the bit stream 116 programs a Configurable Logic Block (CLB) of an FPGA, another sequence of bits, from the same bit stream 116, programs an Input/Output Block (IOB) of the FPGA, while another sequence of bits, from the same bit stream 116, configures the interconnections between the CLB and the IOB. In one embodiment, each sequence of bits is identified for each configurable element by the position in the bit stream 116 of the sequence of bits. In one embodiment, the step 120 is performed using only the netlist 111. In another embodiment, unordered nonsequential sets of bits from the bit stream 116 are used instead of sequences of bits.

Step 120 also extracts a set of transparent circuit parameters 123. These transparent circuit parameters 123 show how the transparent circuits 183, such as boundary scan circuits, are configured. Additionally, the transparent circuit parameters 123 define the control of various configuration modes supported by the PLD 107. For example, in one embodiment, the transparent circuit parameters 123 indicate at what time the PLD 107 is released from reset.

At step 130, the pre-compile representation 137 of the PLD's representation of the circuit design 106 is built. In one embodiment, step 130 includes generating an HDL file that includes several instances of different general models. In another embodiment, the pre-compile representation 137 includes a netlist file instead of the HDL file. Each instance of a general model corresponds to a different configurable element in the PLD. The element ID 121 identifies the type of general model to use (e.g., an IOB general model, a CLB general model, an interconnection element general model, a boundary scan model). The corresponding element program 125 defines some parameters for the instance of the general model, i.e., which circuits to include in a given instance of a general model. In one embodiment, the parameters are bits that select one of several different possible circuits.

Optionally, at step 130, a set of additional parameters 127 are supplied by a user, or other person responsible for performing the conversion. The additional parameters 127 define what additional circuits to include in the pre-compile representation 137. In one embodiment, the additional parameters 127 indicate whether the new integrated circuit 190 should include RAM test circuitry, boundary test circuitry, and scan test observability circuitry. In one embodiment, the additional parameters 127 indicate configuration modes in addition to the configuration mode control in the transparent circuit parameters 123. Specifying additional configuration modes allows the invention to emulate multiple configuration modes of a PLD. Emulating multiple configuration modes is described in greater detail in the U.S. patent application Ser. No. 08/594,933, filed Wednesday, Jan. 31, 1996, entitled, "Configuration Emulation of a Programmable Logic Device," and U.S. patent application Ser. No. XX/XXX,XXX, filed Thursday, Feb. 29, 1996, entitled, "Configuration Emulation of a Programmable Logic Device," assigned to Xilinx, Inc. of San Jose, Calif.

Optionally, at step 130, a set of operational parameters 129 are supplied by a user, or other person responsible for performing the conversion. The operational parameters 129 define functions for the new integrated circuit 190 that are not supported in the PLD 107, for example, full scan testing logic and RAM testing logic. The operational parameters 129 define the operational circuits 199 and may modify the design implementation logic 103.

The additional parameters 127 and the operational parameters 129 are provided to the step 130 in a number of ways, including, using an extra file read in during the step 130, applying command line parameters to the software tool that executes step 130, or by adding the additional parameters 127 and the operational parameters 129 directly to the netlist 111 or to the bit stream 116.

In one embodiment, the pre-compile representation 137 is written in example HDL pseudocode as shown below wherein each instance of a configurable element is represented by a macro of that type, and the parameters for the macro define the particular instance's functions.

```
I/O Hierarchy
{
    IOB instance (IOB program parameters,
                  IOB additional parameters,
                  IOB operational parameters) ;
    . . .
}
Configurable Logic Blocks Hierarchy
{
```

-continued

```
    CLB instance (CLB program parameters,
                  CLB additional parameters,
                  CLB operational parameters) ;
    . . .
}
Transparent Hierarchy
{
    Configuration_Emulation instance (CE program parameters,
                  CE additional parameters,
                  CE operational parameters) ;
    Boundary_Scan instance (BSCAN program parameters,
                  BSCAN additional parameters,
                  BSCAN operational parameters) ;
    . . .
}
Core Hierarchy
{
    Connection_element instance (connection program parameters,
            connection additional parameters,
                  connection operational parameters,
                  connection points to other elements) ;
    IOB instance (connection points to other elements) ;
    CLB instance (connection points to other elements) ;
    Configuration_Emulation instance (connection points to other
                  elements);
    Boundary_Scan instance (connection points to other elements) ;
}
```

In the above example, the I/O hierarchy includes some or all of the instances of the IOBs in the PLD that are used and configured. The CLBs hierarchy includes some or all of the instances of the CLBs in the PLD that are used and configured. The transparent hierarchy includes some or all of the instances of the transparent circuits 183 that are used and configured. The core hierarchy includes instances of the I/O hierarchy, the CLB hierarchy and the configured interconnection elements used to connect the CLBs, the IOBs and any other circuits in the PLD.

Note, in one embodiment, instances are generated for only those configurable elements that are actually used and configured by the bit stream 116, thereby saving space on the new integrated circuit because only those gates that are actually used and configured in the PLD are represented in the new integrated circuit.

Importantly, the pre-compile representation 137 is independent of the target fabrication technology. The pre-compile representation 137 can be used with any of many target fabrication technologies such as: a mask programmed gate array, a standard cell application specific integrated circuit, or some other PLD technology.

At step 140, a compiler converts the pre-compile representation 137 into a post-compile representation 147. The pre-compile representation 137 include an accurate representation of the circuit design 106 in the PLD 107. However, the pre-compile representation 137 also includes a number of unnecessary structures. For example, if a given instance of an input/output block general model is defined as an input port (the parameters to that instance define the instance as an input port), then the structures in that instance that implement output functions are not necessary. The compile step 140 removes the unnecessary structures. In one embodiment, the compiler is a Synopsys Design Compiler™, available from Synopsys, Inc. of Mountain View, Calif. The compiler uses the new target fabrication technology library 142 to generate the post-compile representation 147.

At step 150, a place and route tool is used to place and route the post-compile representation 147 in the target technology. In one embodiment, a place and route software tool from Cadence Systems, Inc. of Santa Clara, Calif. is used, for example, the Gate Ensemble™ tool. The result of step 150 is the specification for fabrication 155, which can include a GDS file.

At step 160, from the specification for fabrication 155, a semiconductor foundry manufactures the new integrated circuit 190 that performs the functions of the circuit design 106, has the extra functions supplied when the circuit design 106 was implemented in the PLD 107, and has any additional functions defined by the operational parameters 129.

In one embodiment, only some configurable elements of the PLD are instantiated using step 120 and step 130. In one embodiment, the CLBs are instantiated as a macro with one parameter being the logic equation performed by the CLB. This logic equation is taken directly from the XNF file.

Using a Bit Stream to Create a Second Representation of a Circuit

Figure 2:
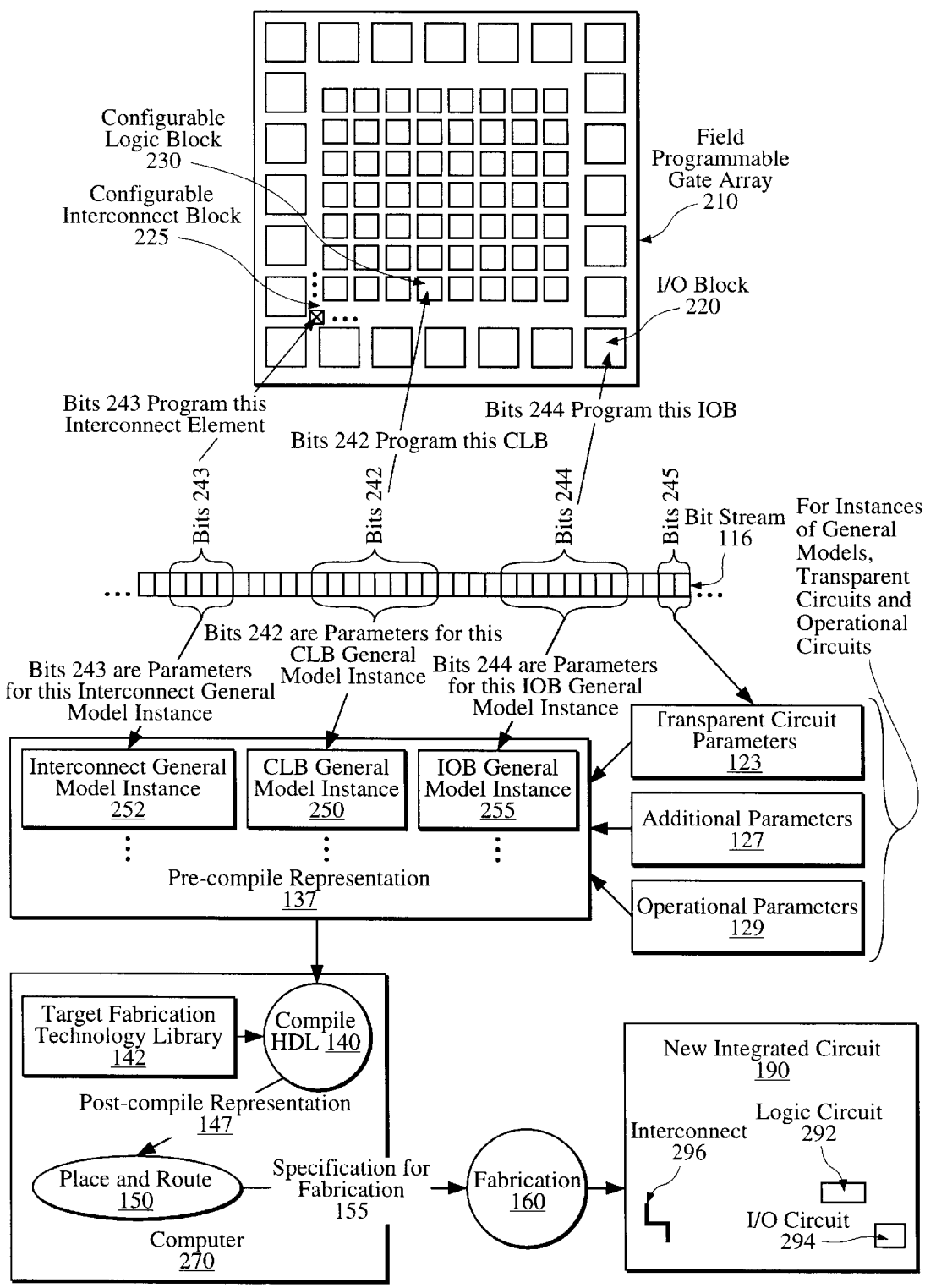
FIG. 2 illustrates using a device specific bitwise representation used to program a PLD to create a new integrated circuit of a circuit design.

FIG. 2 illustrates a bit stream 116, used to program a PLD, to create a second representation of a circuit.

In this example, the PLD includes a field programmable gate array 210 (FPGA 210), although other PLDs can be used in its place (such as a PLD from Altera, Inc.). The FPGA 210 includes many configurable elements, such as, an I/O block (IOB) 220, a configurable logic block (CLB) 230, and a configurable interconnect element 225 (only one shown for simplicity). The bit stream 116 programs the FPGA 210 to perform the function of a particular circuit. The bit stream 116 includes many sequences of bits; each sequence of bits programs a different configurable element in the FPGA 210. For example, the bits 242 program the CLB 230, the bits 243 program the configurable interconnect block 225, while the bits 244 program the IOB 220. Additional bits 245 in the bit stream 116 program the FPGA 210 to, for example, use a particular transparent circuit implementation logic 193. In one embodiment, the pre-compile representation 137 includes a CLB general model instance 250, and/or an IOB general model instance 255, and/or the corresponding interconnect general model instance 252. A specific CLB general model instance 250 has as input parameters the bits 242 and the additional parameters 127. A specific IOB general model instance 255 has as input parameters the bits 244 and the additional parameters 127. A specific interconnect general model instance 252 has as input parameters the bits 243 and the additional parameters 127. The transparent circuit parameters 123 are generated from the bits 245 and act as parameters to some of the instances in, or add new instances to, the pre-compile representation 137, thereby adding additional circuits to the pre-compile representation 137. Similarly, the operational parameters 129 act as parameters to some of the instances in, or add new instances to, the pre-compile representation 137, thereby adding additional circuits to the pre-compile representation 137.

The pre-compile representation 137 is provided to a computer 270, which includes a processor coupled to a memory. In one embodiment, the computer 270 includes one or more IBM PC compatible computers. In another embodiment, the computer 270 includes one or more engineering workstations such as a SparcStation™ from Sun Microsystems, Inc. The memory stores the pre-compile representation 137 and the target fabrication technology library 142. The computer 270 compiles the pre-compile representation 137, places and routes the post-compile representation 147, and then generates the specification for fabrication 155.

The specification for fabrication 155 is provided to the semiconductor foundry. The foundry fabricates the new integrated circuit 190. The new integrated circuit performs the functions of the circuit represented by the bit stream 116. For example, the new integrated circuit 190 includes a logic circuit 292 that performs the functions of the CLB 230 once the CLB 230 is programmed with the bits 242. The new integrated circuit 190 also includes an I/O circuit 294 that performs the functions of the IOB 220 when the IOB 220 is programmed with the bits 244. Also, the new integrated circuit 190 includes an interconnect 296 that performs the interconnection function of the configurable interconnect block 225. Significantly, the new integrated circuit 190 may include the transparent circuits implementation logic 193 and operational circuits 199.

General Model of a Configurable Element

Figure 3:
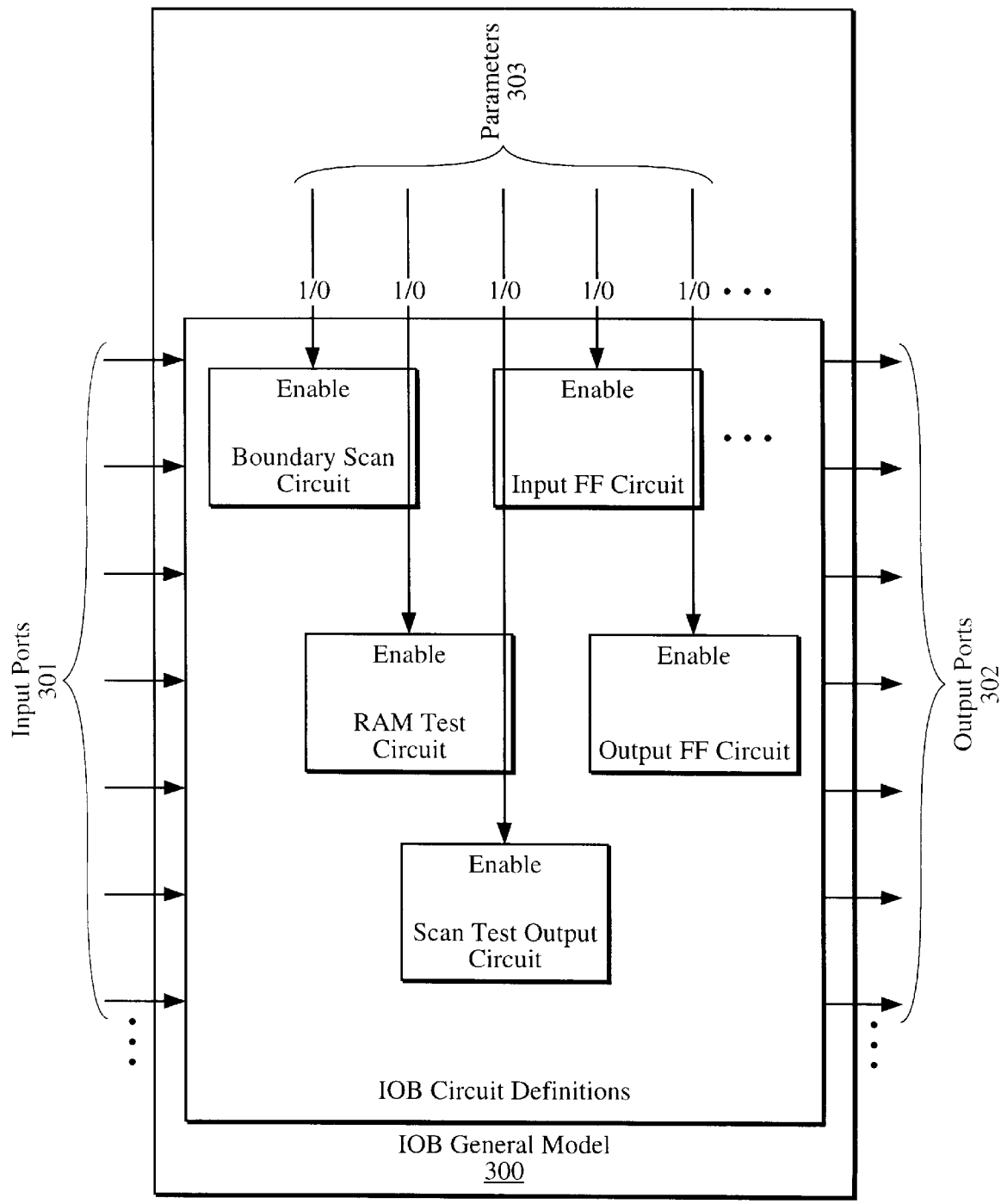
FIG. 3 illustrates a general model of an input/output element.

FIG. 3 illustrates an example embodiment of an input/output block (IOB) general model 300. The IOB general model 300 includes several input ports 301, several output ports 302 and several parameters 303. The parameters 303 permanently enable or disable different structures in the IOB general model 300, thereby permanently configuring an instance of the IOB general model 300 to perform a specific set of functions.

In one embodiment, the structures include, among other structures, boundary scan logic, input and output flip-flop logic, RAM test logic, and scan test logic. The parameters 303 permanently enable or disable a given structure for a given instance of the IOB general model 300. A disabled structure is not needed for that instance of the IOB general model 300, thus, the compiler removes the disabled structure from the post-compiled representation 147. In one embodiment, the compiler does not remove all of the disabled structures.

In one embodiment, the IOB general model 300, for example, corresponds to a general model of an IOB for a Xilinx XC4000 FPGA. In this embodiment, the parameters 303 correspond to the bits 244, some of the transparent circuit parameters 123, some of the additional parameters 127 and some of the operational parameters 129. The input ports 301 and the output ports 302 correspond to input and output ports of the I/O circuit 294.

Importantly, the IOB general model 300 includes circuit structures that the user did not explicitly include in the circuit design 106. However, these circuit structures are automatically included, if necessary, via the transparent circuit parameters 123. Thus, the invention has the advantage of easily incorporating additional circuit structures that are part of the PLD 107, but are not part of the design description 114. Additional circuit structures are included because of the additional parameters 127 and the operational parameters 129. Thus, the invention has the advantage of allowing the inclusion of additional circuit structures that should be included in the new integrated circuit, but may not exist in either the design description 114 or the transparent circuit parameters 123.

Figure 4:
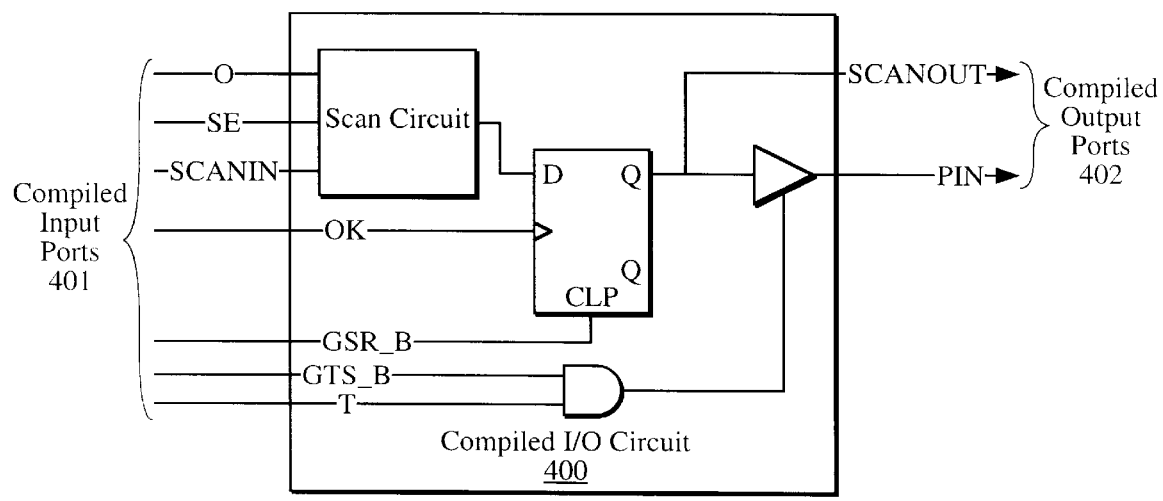
FIG. 4 illustrates a compiled input/output circuit.

FIG. 4 illustrates a compiled I/O circuit 400 for a Xilinx XC4000 FPGA. The compiled I/O circuit 400 supports the functions of an FPGA IOB programmed to be an output with a flip-flop. The compiled I/O circuit 400 also supports the scan test circuit as specified in the operational parameters 129. The compiled I/O circuit 400 includes a set of compiled input ports 401, a set of compiled output ports 402, and a number of internal structures. Importantly, the compiled I/O circuit 400 includes only those ports and structures needed to perform it's required function. The compiler has removed all of the other circuitry of the instance of the IOB general model 300. Thus, the compiled I/O circuit 400 includes far fewer input ports, output ports and gates than the IOB general model 300.

Importantly, the above example illustrates the simplicity of supporting one embodiment of the invention. Rather than support a complex software tool, as described in the background, to perform many tests on an XNF file, only the general models need to be supported. These general models can be more easily modified than the previous complex software tools. Additional general models for new PLD technologies can be added.

An additional benefit of the invention is that the accuracy of the pre-compile representation 137 is guaranteed because it is derived directly from the bit stream 116 used to program the PLD. Because accuracy is improved, the turn around time to give a customer the design in the new fabrication technology is reduced considerably over previous systems.

This description of various embodiments of the invention has been presented for illustration. The description is not to limit the invention to the precise embodiments disclosed. Instead, the following claims define the scope of the invention.

What is claimed is:

1. A computer implemented method comprising:

accessing a first representation of a circuit, said first representation for programming said programmable logic device to implement said circuit, said programmable logic device having a plurality of configurable elements, said plurality of configurable elements including a first configurable element;

generating a plurality of general model instances which correspond to said plurality of configurable elements;

accessing a first portion of said first representation, said first portion for programming said first configurable element;

identifying a first general model instance which corresponds to said first configurable element; and configuring said first general model instance using said first portion, thereby forming part of a second representation of said circuit.

2. The computer implemented method of claim 1 wherein accessing said first portion includes accessing a portion of a bit stream.

3. The computer implemented method of claim 1 wherein accessing said first portion includes accessing a netlist representation of said circuit.

4. The computer implemented method of claim 1 wherein accessing said first portion and configuring said first general model instance respectively include:

accessing a hardware description language representation of said first configurable element; and using data from said hardware description language representation as a set of parameters to configure said first general model instance.

5. The computer implemented method of claim 1 wherein accessing a first portion of said first representation includes parsing a bit stream.

6. The computer implemented method of claim 1 wherein said second representation includes a hardware description language representation of said circuit, and wherein said method further comprises the step of:

compiling said second representation of said circuit into a third representation of said circuit using a fabrication technology library, said third representation including a description of a plurality of devices that implement said circuit using said fabrication technology, said third representation including a description of a compiled circuit corresponding to the configured first general element model instance.

7. A computer system comprising:

a memory storing a first model of a first element, said first element being programmable to perform a function, said first model including a general model of a configurable element and a set of parameters, said configurable element being part of a programmable logic device, said set of parameters corresponding to a set of instructions used to program said first element to perform said function; and a processor, said memory being coupled in communication with said processor, for accessing and manipulating said first model.

8. The computer system of claim 7 wherein said general model includes a hardware description language macro of said configurable element including a set of values for said hardware description language macro.

9. The computer system of claim 7 wherein said configurable element includes a function generator and wherein said programmable logic device includes a field programmable gate array.

10. The computer system of claim 7 wherein said set of instructions includes a sequence of ones and zeroes used to program said first element.

11. The computer system of claim 7 wherein said memory further includes a fabrication technology library.

12. The computer system of claim 7 wherein said general model includes a boundary scan circuit model and said set of parameters includes a parameter for creating a boundary scan circuit.

13. The computer system of claim 7 wherein said general model includes a timing compensation circuit model and said set of parameters includes a parameter for creating a timing compensation circuit.

14. The computer system of claim 7 wherein said general model includes a scan path circuit model.

15. A computer implemented method of converting a first representation of a circuit into a second representation of said circuit, said circuit for performing a set of functions, said method comprising the steps of:

accessing a storage device including a bit stream, said bit stream for programming a programmable logic device to perform said set of functions;

identifying a plurality of bit sequences from said bit stream, each bit sequence of said plurality of bit sequences for programming a respective configurable element of said programmable logic device;

generating a plurality of general hardware description language models, each general hardware description language model being configured using as inputs a different bit sequence of said plurality of bit sequences, and wherein said second representation of said circuit includes a plurality of configured hardware description language models.

16. The computer implemented method of claim 15 wherein said bit stream programs an erasable programmable logic device to perform said set of functions.

17. The computer implemented method of claim 15 wherein said identifying said plurality of bit sequences includes, identifying a first bit sequence, said first bit sequence for programming an input/output element of said programmable logic device, and wherein said generating a plurality of general hardware description language models includes, accessing said storage device for the general hardware description language model of said input/output element, and generating a first hardware description language model having a set of parameters defined by said first bit sequence.

18. The computer implemented method of claim 15 wherein said identifying said plurality of bit sequences includes:

identifying a type of configurable element associated with each bit sequence of said plurality of bit sequences; and identifying a set of instructions for programming each bit sequence of said plurality of bit sequences.

19. The computer implemented method of claim 15 wherein a first configured hardware description language model includes a set of parameters that configured the corresponding general hardware description language model during configuration.

* * * * *